(12) United States Patent
Seff et al.

(10) Patent No.: US 7,239,502 B1
(45) Date of Patent: Jul. 3, 2007

(54) METER CENTER AND MULTI-PHASE MULTIPLE METER SOCKET ASSEMBLY THEREFOR

(75) Inventors: Paul D. Seff, Lincoln, IL (US); Serle K. Cupp, Mason City, IL (US); Marc E. Schoonover, Lincoln, IL (US); James M. Campbell, Atlanta, IL (US)

(73) Assignee: Eaton Corporation, Cleveland, OH (US)

( * ) Notice: Subject to any disclaimer, the term of this patent is extended or adjusted under 35 U.S.C. 154(b) by 0 days.

(21) Appl. No.: 11/337,044

(22) Filed: Jan. 20, 2006

(51) Int. Cl.
*H02B 1/26* (2006.01)
*H02B 1/20* (2006.01)
*H01R 25/00* (2006.01)

(52) U.S. Cl. .................. 361/624; 361/637; 361/664; 361/675; 439/114; 439/212

(58) Field of Classification Search .............. 361/601, 361/648, 622–624, 664, 637, 675; 312/223.1; 454/184; 174/50; 439/517, 212, 114–115, 439/508
See application file for complete search history.

(56) References Cited

U.S. PATENT DOCUMENTS

| | | | | |
|---|---|---|---|---|
| 4,327,396 A * | 4/1982 | Schacht | ................ | 361/676 |
| 4,532,574 A * | 7/1985 | Reiner et al. | ................ | 361/660 |
| 5,414,590 A * | 5/1995 | Tajali | ................ | 361/669 |
| 5,951,324 A * | 9/1999 | Campbell et al. | ................ | 439/517 |
| 5,980,311 A * | 11/1999 | Campbell et al. | ................ | 439/517 |
| 5,982,611 A * | 11/1999 | Campbell et al. | ................ | 361/664 |
| 6,012,937 A | 1/2000 | Campbell et al. | | |
| 6,163,449 A * | 12/2000 | Flegel | ................ | 361/601 |
| 6,421,229 B1 * | 7/2002 | Campbell et al. | ................ | 361/622 |
| 6,561,844 B1 * | 5/2003 | Johnson | ................ | 439/507 |
| 7,040,921 B2 * | 5/2006 | Kellerman | ................ | 439/517 |

\* cited by examiner

*Primary Examiner*—Jayprakash Gandhi
*Assistant Examiner*—Bradley H Thomas
(74) *Attorney, Agent, or Firm*—Martin J. Moran

(57) ABSTRACT

A multi-phase multiple meter socket assembly is for a meter center including a plurality of meters. The meter socket assembly includes meter sockets each receiving one of said meters, feeder buses, supply buses, and a plurality of phase connectors. Each of the supply buses has at least one section, and each phase connector electrically interconnects a corresponding one of the at least one section of each of the supply buses with a corresponding one of the feeder buses. At least one of the supply buses is divided in order to include as the at least one section, first and second sections, the first section being in electrical communication with a first one of the feeder buses and the second section being in electrical communication with a second one of the feeder buses. In this manner, the meters are provided with a plurality of phase configurations within the same cabinet.

20 Claims, 4 Drawing Sheets

METER CENTER AND MULTI-PHASE MULTIPLE METER SOCKET ASSEMBLY THEREFOR

BACKGROUND OF THE INVENTION

1. Field of the Invention

The present invention relates generally to meter centers for electrical power distribution systems and, more particularly, to a meter center including a multiple meter socket assembly structured to provide a plurality of phase combinations among a plurality of meters. The invention also relates to multi-phase multiple meter socket assemblies for meter centers.

2. Background Information

Meter centers including a plurality of watt-hour meters are commonly used to measure electric power consumed by the various tenants of a multi-unit residential site (e.g., without limitation, an apartment building) or commercial site (e.g., without limitation, an office complex).

FIGS. 1 and 2 show a conventional meter center assembly 1, which generally consists of a cabinet 3 having an internal longitudinal wall 5 that divides the cabinet 3 into side-by-side meter and disconnect switch compartments 7, 9. A plurality of plug-in, socket type watt-hour meters 11 are mounted within the meter compartment 7, one meter 11 for each tenant circuit which is to be metered. Thus, in the example of FIG. 1, the meter center 1 accommodates four tenant circuits each served by its own meter 11. Each tenant circuit is also provided with a disconnect switch 13 such as, for example, a circuit breaker, which is mounted within the disconnect switch compartment 9.

Electric power is provided to the meter center 1 by feeder buses 17 which are electrically connected to the utility lines (not shown) that supply power. Specifically, as shown in FIG. 2, three phase buses 17A, 17B, 17C and a neutral bus 17N extend horizontally through the cabinet 3 for connection to the utility lines (not shown). A set of supply buses 27 extend vertically within the meter compartment 7 and electrically connect to the feeder buses. More specifically, the supply buses 27 generally comprise a pair of spaced apart bus bars 29R, 29L which are each electrically connected to one of the feeder buses 17A, 17B, 17C by one of the phase balancers 47A, 47B. For example, the left supply bus 29L in the example of FIG. 2 is electrically connected to the phase A feeder bus 17A by phase balancer 47A, and the right supply bus 29R is electrically connected to the phase B feeder bus 17B by phase balancer 47B. Phase balancer 47A generally consists of a cylindrical sleeve 49 and bolt 51. Phase balancer 47B generally consists of a Z-shaped member 53 and bolts 55. Thus, the entire meter center 1 is configured in the same manner, in this case phase AB, although it will be appreciated that it could also be entirely phased AC (for feeder buses 17A and 17C) or BC (for feeder buses 17B and 17C).

Accordingly, it will be appreciated that known conventional meter centers provide only one phase configuration within the entire cabinet. In other words, the entire cabinet must be phased AB, AC, or BC. Among other disadvantages, this makes phase balancing (i.e., distributing the electrical load) difficult where, for example, multiple meter centers are ganged together in order to individually meter power consumption by multiple different tenants in the same building or facility.

There is, therefore, room for improvement in meter centers and in multiple meter socket assemblies therefor.

SUMMARY OF THE INVENTION

These needs and others are met by the present invention, which is directed to a meter center having a multi-phase multiple meter socket assembly wherein different meters within the same cabinet are phased differently.

As one aspect of the invention, a multi-phase multiple meter socket assembly is provided for a meter center including a plurality of meters. The multi-phase multiple meter socket assembly comprises: a plurality of meter sockets, each of the meter sockets being structured to receive one of the meters; a plurality of feeder buses; a plurality of supply buses, each of the supply buses being in electrical communication with the meter sockets and including at least one section which is in electrical communication with a corresponding one of the feeder buses; and a plurality of phase connectors, each of the phase connectors electrically interconnecting a corresponding one of the at least one section of each of the supply buses with a corresponding one of the feeder buses in order to provide electrical communication therebetween. At least one of the supply buses is divided in order to include as the at least one section, a first section and a second section, the first section being in electrical communication with a first one of the feeder buses and the second section being in electrical communication with a second one of the feeder buses in order to provide a first number of the meter sockets with a first phase configuration and a second number of the meter sockets with a second phase configuration. The second phase configuration is different from the first phase configuration.

The feeder buses may comprise a first feeder bus, a second feeder bus, a third feeder bus, and a neutral bus, and the supply buses may comprise a first supply bus and a second supply bus. The first feeder bus, the second feeder bus, the third feeder bus, and the neutral bus may extend substantially horizontally with respect to the meter sockets, and the first and second supply buses may extend generally vertically with respect to the meter sockets. The at least one of the supply buses may be the first supply bus wherein the first section of the first supply bus is electrically connected to the first number of the meter sockets, wherein the second section of the first supply bus is electrically connected to the second number of the meter sockets, and wherein the second supply bus is electrically connected to both the first number of the meter sockets and the second number of the meter sockets.

The first feeder bus may be an A phase bus, the second feeder bus may be a B phase bus, the third feeder bus may be a C phase bus, and the plurality of phase connectors may include an A phase connector, a B phase connector, and a C phase connector. The A phase connector electrically connects the second section of the first supply bus to the A phase bus, the B phase connector electrically connects the first section of the first supply bus to the B phase bus, and the C phase connector electrically connects the second supply bus to the C phase bus, in order that the first phase configuration of the first number of the meter sockets is BC and the second phase configuration of the second number of the meter sockets is AC. The meter center may include as the first number of the meter sockets, two meter sockets having as the first phase configuration, BC, and may further include as the second number of the meter sockets, at least two meters having as the second phase configuration, AC. The second number of the meter sockets may comprise three meter sockets.

The B phase connector may comprise a generally Z-shaped member coupled at one end to the first section of the first supply bus and at the other end to the B phase bus. The A phase connector and the C phase connector may each comprise a conductive member and a fastener wherein the conductive member of the A phase connector is interposed between the A phase bus and the second section of the first supply bus, and the C phase connector is interposed between the C phase bus and the second supply bus. The fastener is structured to secure the conductive member, when tightened.

As another aspect of the invention, a meter center comprises: a cabinet including a meter compartment; a plurality of meters; and a meter socket assembly comprising: a plurality of meter sockets housed by the meter compartment and receiving the meters; a plurality of feeder buses extending from the cabinet, a plurality of supply buses, each of the supply buses being in electrical communication with the meter sockets and including at least one section which is in electrical communication with a corresponding one of the feeder buses, and a plurality of phase connectors, each of the phase connectors electrically interconnecting a corresponding one of the at least one section of each of the supply buses with a corresponding one of the feeder buses in order to provide electrical communication therebetween. At least one of the supply buses is divided in order to include as the at least one section, a first section and a second section, thereby being in electrical communication with more than one of the feeder buses in order to provide the meter sockets with a plurality of phase configurations within the cabinet.

The cabinet may be a single cabinet, and the meters may comprise watt-hour meters which are all housed by the single cabinet. The phase configurations within the single cabinet may comprise a first phase configuration and a second phase configuration. Wherein a first number of the watt-hour meters have the first phase configuration and a second number of the watt-hour meters have the second phase configuration, which is different from the first phase configuration.

As another aspect of the invention, a meter center comprises: a plurality of cabinets, each of the cabinets including a meter compartment, a plurality of meters, and a meter socket assembly comprising: a plurality of meter sockets housed by the meter compartment and receiving the meters, a plurality of feeder buses, a plurality of supply buses, each of the supply buses being in electrical communication with the meter sockets and including at least one section which is in electrical communication with a corresponding one of the feeder buses, and a plurality of phase connectors, each of the phase connectors electrically interconnecting a corresponding one of the at least one section of each of the supply buses with the corresponding one of the feeder buses in order to provide electrical communication therebetween. At least one of the supply buses is divided in order to include as the at least one section, a first section and a second section, the at least one of the supply buses being in electrical communication with a plurality of the feeder buses in order to provide the meter sockets with a plurality of phase configurations within each of the cabinets. A plurality of the cabinets are ganged together in order to provide electrical communication therebetween.

BRIEF DESCRIPTION OF THE DRAWINGS

A full understanding of the invention can be gained from the following description of the preferred embodiments when read in conjunction with the accompanying drawings in which.

DESCRIPTION OF THE PREFERRED EMBODIMENTS

Figure 1:
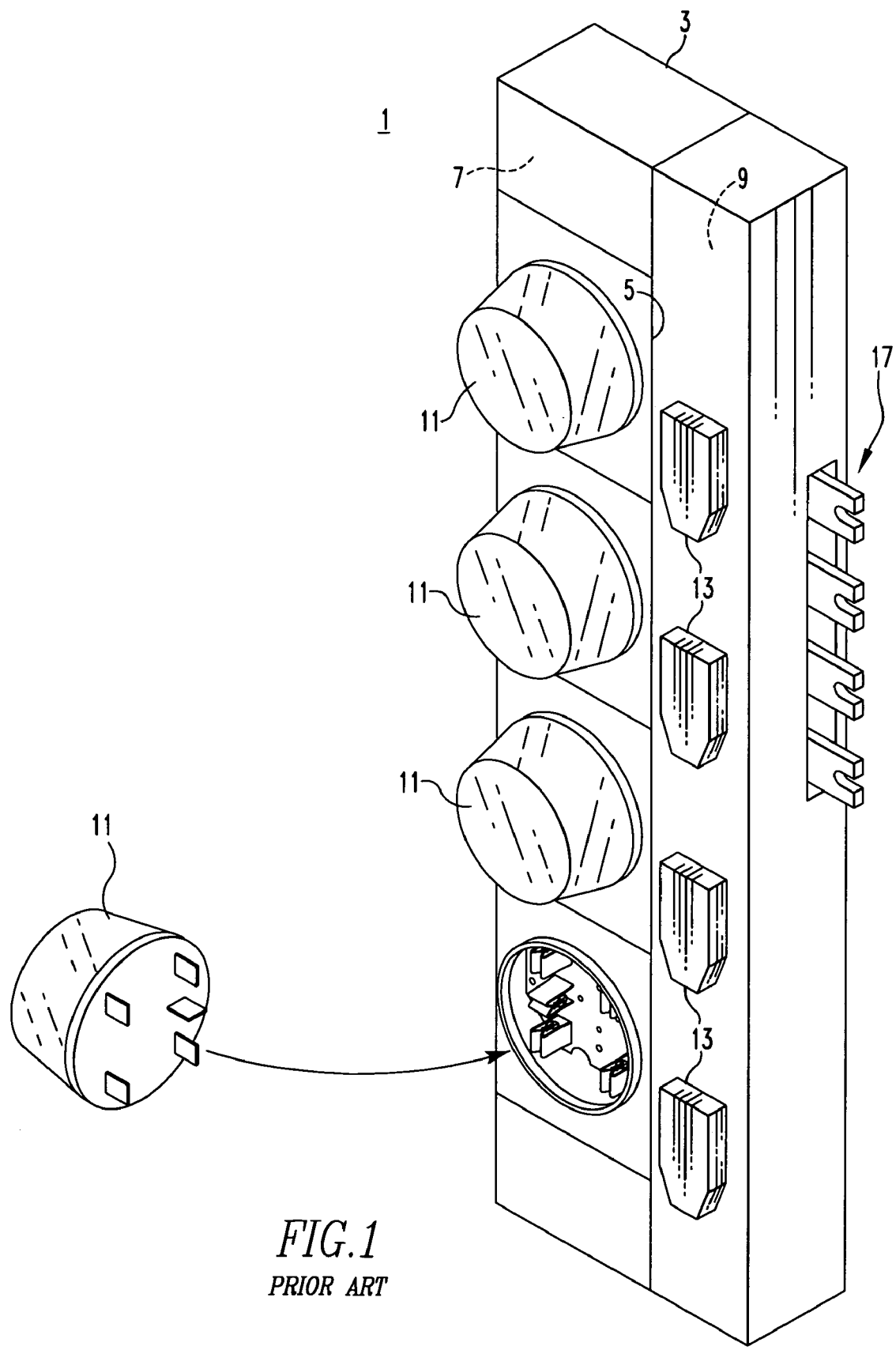
FIG. 1 is an isometric view of a meter center having a cabinet with four meters, with one of the meters removed to show details of a meter socket assembly.
Figure 2:
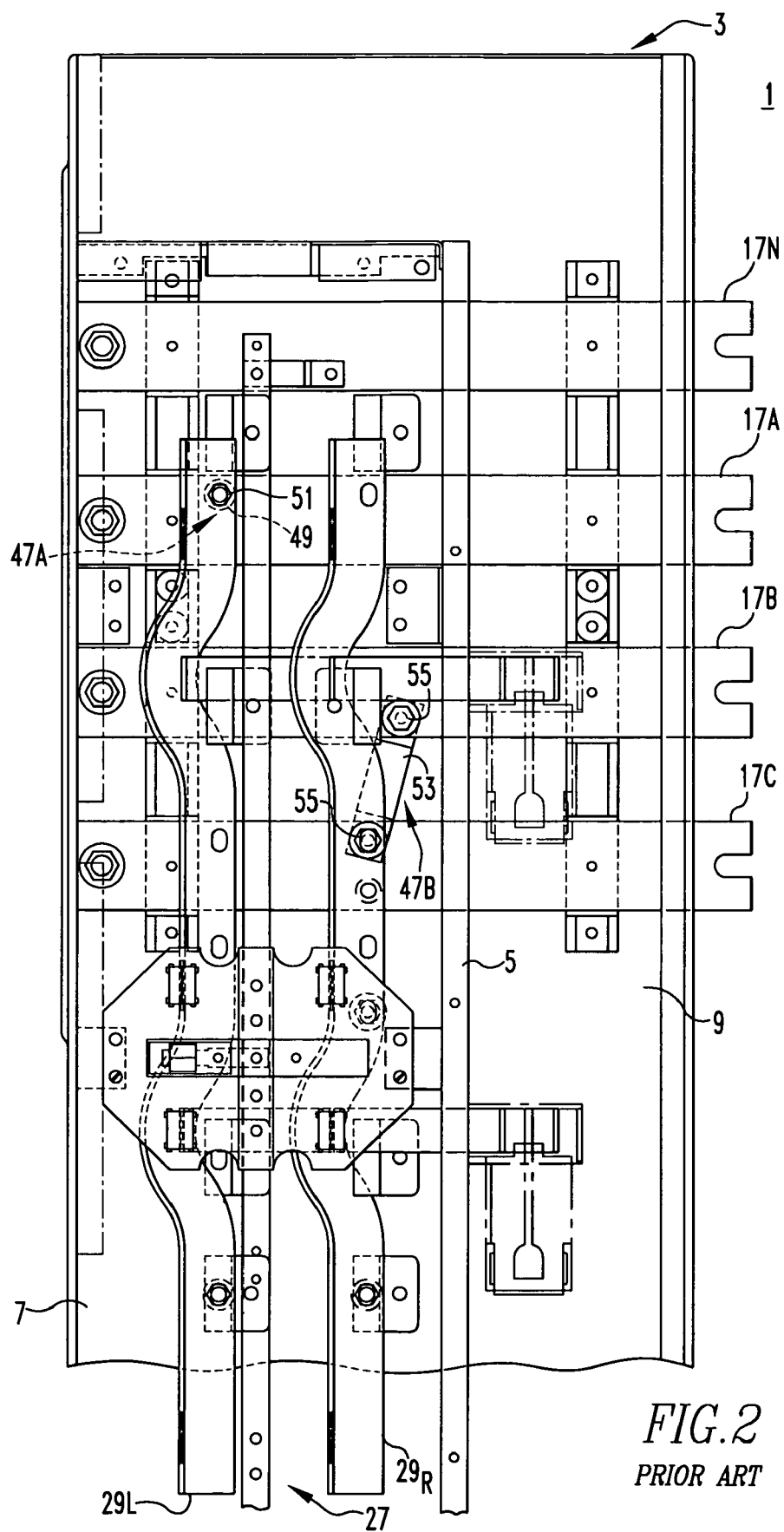
FIG. 2 is a vertical elevational view of a top portion of the meter center of FIG. 1, with the cover of the cabinet removed to show internal details.

For purposes of illustration, the invention will be described as applied to meter centers having four or five watt-hour meters, although it will be appreciated that the invention is applicable to meter centers having any suitable number of meters wherein it is desired to have a plurality of different phase configurations (i.e., split-phasing or multi-phasing) within the same meter center.

Directional phrases used herein, such as, for example, left, right, top, bottom, upper, lower and derivatives thereof, relate to the orientation of the elements shown in the drawings and are not limiting upon the claims unless expressly recited therein.

As employed herein, the terms "multi-phase" and "split-phase" refer to the fact that the multiple meter socket assembly in accordance with the invention provides a plurality of different phase configurations (e.g., AB; BC; AC) within a single cabinet of the meter center. In other words, the phases are split within the cabinet such that, for example, a number of the meter sockets have a first phase configuration, while others have a second, different phase configuration. By way of example, a meter center having two different phase configurations within a single cabinet is "dual-phased" in accordance with the invention.

As employed herein, the statement that a part is "electrically interconnected with" one or more other parts shall mean that the parts are directly electrically connected together or are electrically connected together through one or more electrical conductors or generally electrically conductive intermediate parts. Further, as employed herein, the statement that a part is "electrically connected to" one or more other parts shall mean that the parts are directly electrically connected together or are electrically connected together through one or more electrical conductors.

As employed herein, the term "ganged" refers to a grouping of two or more meter cabinets which are coupled together electrically and/or mechanically to form the meter center. For example, busing of one cabinet is electrically coupled to busing of another cabinet in order to interconnect the cabinets and provide electrical communication therebetween.

As employed herein, the term "fastener" refers to any suitable connecting or tightening mechanism expressly including, but not limited to, rivets, screws, bolts and the combinations of bolts and nuts (e.g., without limitation, lock nuts) and bolts, washers and nuts.

As employed herein, the statement that two or more parts are "coupled" together shall mean that the parts are joined together either directly or joined through one or more intermediate parts.

As employed herein, the term "number" shall mean one or more than one (i.e., a plurality).

Figure 3:
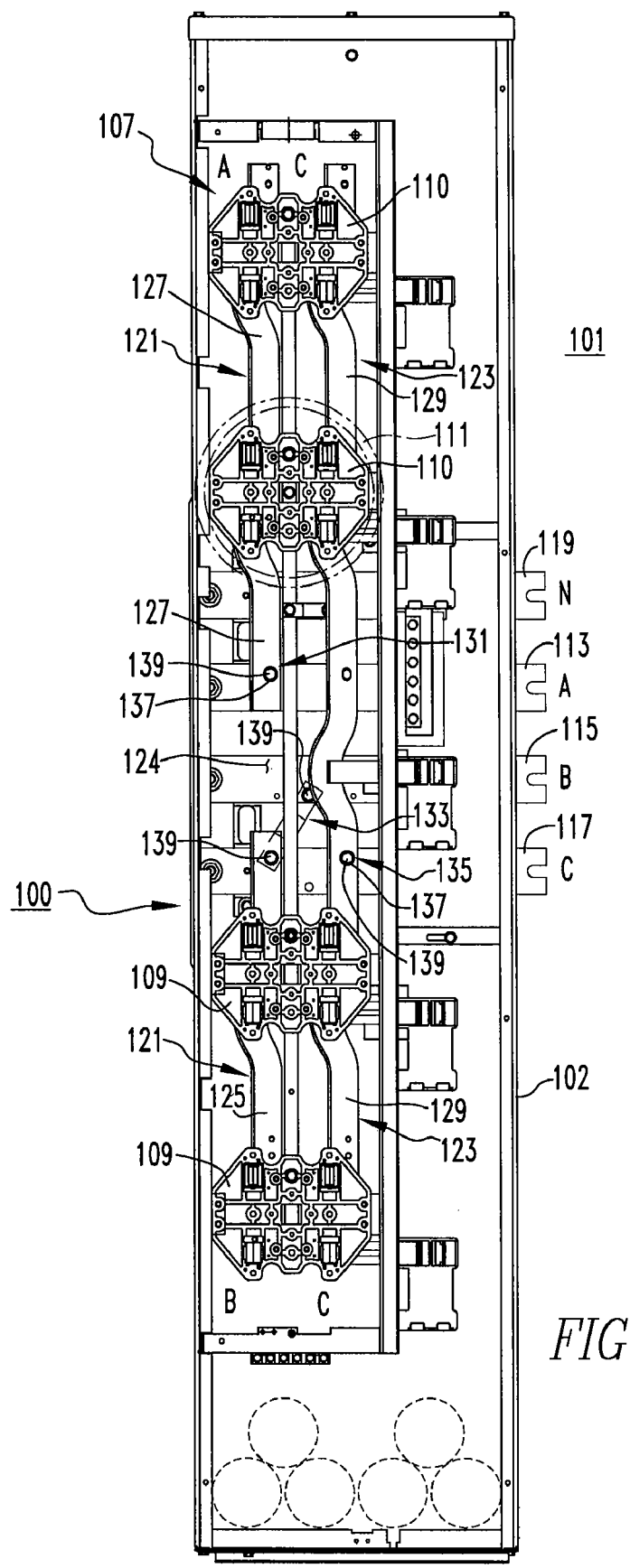
FIG. 3 is a vertical elevational view of a multi-phase meter center in accordance with the present invention, with one meter shown in phantom line drawing and with one meter socket removed to show internal busing.

FIG. 3 shows a multi-phase multiple meter socket assembly 100 for meter center 101 in accordance with the invention. The meter center 101 includes a cabinet 102 having a meter compartment 107 that houses a plurality of meter sockets 109, 110 for receiving meters 111 (one meter 111 is shown in phantom line drawing in FIG. 3). The multi-phase multiple meter socket assembly 100 is substantially disposed within the meter compartment 107.

The multi-phase multiple meter socket assembly 100 in the example of FIG. 3 is designed to include five meter sockets 109, 110, although one meter socket (third from the top of FIG. 3) has been removed for simplicity of illustration of the busing configuration thereunder. It will, however, be appreciated that any known or suitable number and configuration of meter sockets could be employed. The multi-phase multiple meter socket assembly 100 further includes a plurality of feeder buses 113, 115, 117, 119, a plurality of supply buses 121, 123, and a plurality of phase connectors 131, 133, 135. As will be described herein, each of the supply buses 121, 123 is in electrical communication with the meter sockets 109, 110 and includes at least one section 125, 127, 129 which is in electrical communication with a corresponding one of the feeder buses 113, 115, 117, 119. Thus, for example, in FIG. 3, the first supply bus 121 has two sections, a first section 125 in electrical communication with feeder bus 115 by way of phase connector 133, and a second section 127 in electrical communication with feeder bus 113 by way of phase connector 131. The second supply bus 123 has one section 129 in electrical communication with feeder bus 117. Each of the phase connectors 131, 133, 135 electrically interconnects a corresponding one of the sections 125, 127, 129 of each of the supply buses 121, 123 with the corresponding one of the feeder buses 113, 115, 117, 119, in order to provide the electrical communication therebetween.

At least one of the supply buses 121, 123 is divided in order that the at least one section 125, 127, 129 of the supply bus 121, 123 comprises a first section 125 and a second section 127. As previously discussed, in the example of FIG. 3, the first supply bus 121 is divided. Specifically, a break or gap 124 in the first supply bus 121 is present between the first section 125 and the second section 127 thereof. It will, however, be appreciated that any suitable alternative supply bus configuration (not shown) could be alternatively employed without departing from the scope of the invention. For example, second supply bus 123 could include a number of gaps (not shown).

In this manner, the first section 125 is electrically interconnected with a first one of the feeder buses 113, 115, 117, and the second section 127 is electrically interconnected with a second one of the feeder buses 113, 115, 117 in order to provide a first number of the meter sockets 109 with a first phase configuration, and a second number of the meter sockets 110 with a second phase configuration. The second phase configuration (e.g., without limitation, AB, AC, or BC) is different from the first phase configuration (e.g., without limitation, AB, AC, or BC). More specifically, as previously noted, the meter center design in the example of FIG. 3 is for five meter sockets 109, 110, although one meter socket (third from the top of FIG. 3) has been removed for simplicity of illustration. The first number of meter sockets 109 includes two meter sockets, and the second number of meter sockets 110 includes three meter sockets, one of which has been removed in FIG. 3. However, it will be appreciated that any suitable number of meter sockets could be employed. For example, the multi-phase multiple meter sockets assembly 100 of the invention could be employed with a four meter center having four corresponding meter sockets (not shown). It will also be appreciated that in such an example, the first number of meter sockets 109 could be one, two or three meter sockets 109, in which case the second number of meter sockets 110 would be three, two or one, respectively. Accordingly, in one example of a four meter center (not shown) in accordance with the invention, the meter center could have two meter sockets phased BC and the other two meter sockets phased AC, all within a single cabinet.

Continuing to refer to FIG. 3, the feeder buses comprise a first feeder bus or A phase bus 113, a second feeder bus or B phase bus 115, a third feeder bus or C phase bus 117, and the neutral bus 119. These feeder buses 113, 115, 117 extend substantially horizontally with respect to the meter sockets 109, 110 and extend from cabinet 102 (to the right of cabinet 102 in FIG. 3), as shown. The first and second supply buses 121, 123 extend generally vertically with respect to the meter sockets 109, 110, within cabinet 102. The plurality of phase connectors includes an A phase electrical connector 131, a B phase electrical connector 133, and a C phase electrical connector 135.

The configuration and operation of the aforementioned busing of the exemplary multi-phase multiple meter socket assembly 100 will now be described and understood with reference to the vertical elevational view of FIG. 3 and the bottom plan view of FIG. 4.

Specifically, the A phase connector 131 electrically connects the second section 127 of first supply bus 121 to the A phase bus 113. The B phase connector 133 electrically connects the first section 125 of first supply bus 121 to the B phase bus 115, and the C phase connector 135 electrically connects second supply bus 123 to the C phase bus 117. Accordingly, the first phase configuration of the first number of meter sockets 109 is BC, and the second phase configuration of the second number of meter sockets 110 is AC. Thus, in the example of FIG. 3, two meter sockets 109 (toward the bottom of FIG. 3) have the first phase configuration, BC, and three meter sockets 110 (two are shown toward the top of FIG. 3) have the second phase configuration, AC, such that meter center 101 is split-phased or dual-phased within the single cabinet 102. Among other advantages, this multi-phasing aspect of the invention greatly improves the ability for a utility company to phase-balance the meter center 101, particularly where the meter center comprises a plurality of cabinets which are ganged together (see, for example, ganged cabinets 102, 102' of meter center 101' in the example of FIG. 4).

In the embodiments shown and described herein, the A phase connector 131 and C phase connector 135 each comprise a conductive member 137 and a fastener 139. The conductive member 137 generally comprises a tubular member made from a conductive material such as, for example and without limitation, copper, and is interposed between the feeder bus 113, 115, 117 and corresponding section 125, 127, 129 of one of the supply buses 121, 123. More specifically, the A phase connector 131 is interposed between the A phase bus 113 and the second section 127 of first supply bus 121. This will further be appreciated with reference to the C phase connector 135 which, as shown in FIG. 4, is similarly interposed, but between the C phase bus 117 and second supply bus 123. All of the phase connectors 131, 133, 135 employ a number of fasteners, such as the bolt 139 shown, which is tightened to secure the phase connector 131, 133, 135 in the desired position.

Figure 4:
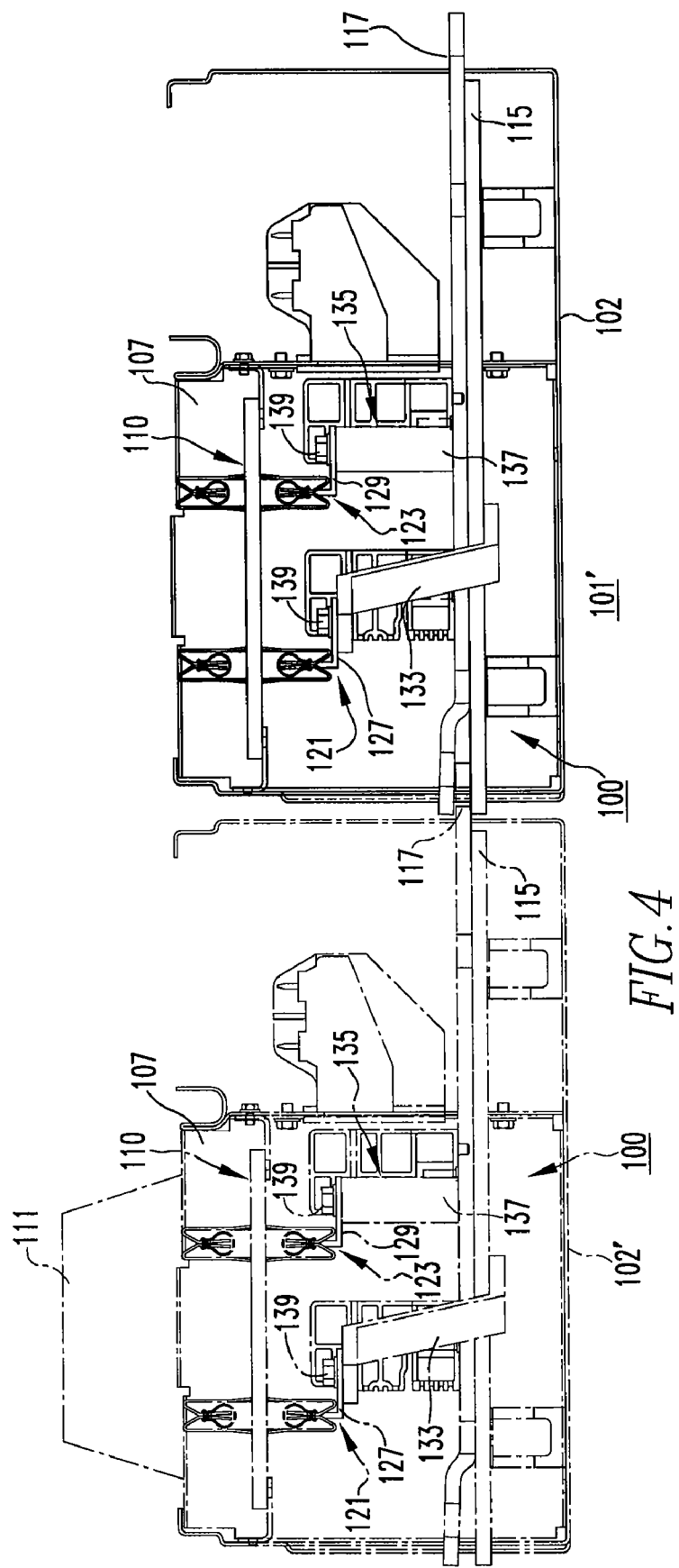
FIG. 4 is a bottom plan view of the multi-phase meter center of FIG. 3.

The exemplary B phase connector comprises a generally Z-shaped member 133, best shown in FIG. 4, which is coupled at one end to the first section 125 of first supply bus 121, and at the other end to the B phase bus 115. It will, however, be appreciated that any known or suitable number and configuration of phase connectors other than or in addition to those shown and described herein, could be employed to provide the various electrical interconnections of the multi-phase multi-meter socket assembly and achieve the desired phase configurations. For example, without limitation, while the phase connectors shown and described herein are stationary, it will be appreciated that one or more of the phase connectors could be movable (i.e., pivotable) among a number of different positions in order to provide a variety of different phase configuration options.

FIG. 4 also illustrates another aspect of the present invention. Specifically, in addition to applications where the meter center 101 comprises a single cabinet 102, as shown in FIG. 3, the meter center 101' could alternatively comprise a plurality of cabinets 102, 102' (two cabinets 102, 102' are shown in the example of FIG. 4) which are ganged together to provide electrical communication therebetween. Specifically, in the example of FIG. 4, a second cabinet 102' is shown in phantom line drawing in one of a wide variety of possible positions ganged with cabinet 102. One meter 111 is shown in phantom line drawing. In the example of FIG. 4, cabinets 102, 102' are ganged (i.e., electrically interconnected) via at least one of the feeder buses (e.g., feeder buses 115 and 117 are shown in FIG. 4). It will, however, be appreciated that any suitable number of cabinets could be ganged in any suitable configuration without departing from the scope of the present invention. It will further be appreciated that in addition to being electrically interconnected, the cabinets 102, 102' could also be optionally mechanically coupled together using any known or suitable fastening mechanism.

Accordingly, the unique multi-phase meter socket assembly of the present invention provides a plurality of different phase configurations, as desired, within a single meter cabinet.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the invention which is to be given the full breadth of the claims appended and any and all equivalents thereof.

What is claimed is:

1. A multi-phase multiple meter socket assembly for a meter center including a plurality of meters, said multi-phase multiple meter socket assembly comprising:
a plurality of meter sockets, each of said meter sockets being structured to receive one of said meters;
a plurality of feeder buses;
a plurality of supply buses, each of said supply buses being in electrical communication with said meter sockets and including at least one section which is in electrical communication with a corresponding one of said feeder buses; and
a plurality of phase connectors, each of said phase connectors electrically interconnecting a corresponding one of said at least one section of each of said supply buses with a corresponding one of said feeder buses in order to provide electrical communication therebetween,
wherein at least one of said supply buses is divided in order to include as said at least one section, a first section and a separate second section, the separate second section being spaced apart from the first section, the first section being in electrical communication with a first one of said feeder buses and the separate second section being in electrical communication with a second one of said feeder buses in order to simultaneously provide a first number of said meter sockets with a first phase configuration and a second number of said meter sockets with a second phase configuration, said second phase configuration being different from said first phase configuration.

2. The multi-phase multiple meter socket assembly of claim 1 wherein said feeder buses comprise a first feeder bus, a second feeder bus, a third feeder bus, and a neutral bus; and wherein said supply buses comprise a first supply bus and a second supply bus.

3. The multi-phase multiple meter socket assembly of claim 2 wherein said first feeder bus, said second feeder bus, said third feeder bus, and said neutral bus extend substantially horizontally with respect to said meter sockets; and wherein said first and second supply buses extend generally vertically with respect to said meter sockets.

4. The multi-phase multiple meter socket assembly of claim 2 wherein said at least one of said supply buses is said first supply bus; wherein the first section of said first supply bus is electrically connected to said first number of said meter sockets; wherein the separate second section of said first supply bus is electrically connected to said second number of said meter sockets; and wherein said second supply bus is electrically connected to both said first number of said meter sockets and said second number of said meter sockets.

5. The multi-phase multiple meter socket assembly of claim 4 wherein said first feeder bus is an A phase bus; wherein said second feeder bus is a B phase bus; wherein said third feeder bus is a C phase bus; wherein said plurality of phase connectors includes an A phase connector, a B phase connector, and a C phase connector; wherein said A phase connector electrically connects the separate second section of said first supply bus to said A phase bus; wherein said B phase connector electrically connects the first section of said first supply bus to said B phase bus; and wherein said C phase connector electrically connects said second supply bus to said C phase bus, in order that said first phase configuration of said first number of said meter sockets is BC and said second phase configuration of said second number of said meter sockets is AC.

6. The multi-phase multiple meter socket assembly of claim 5 wherein said meter center includes as said first number of said meter sockets, two meter sockets having as said first phase configuration, BC; and wherein said meter center includes as said second number of said meter sockets, at least two meter sockets having as said second phase configuration, AC.

7. The multi-phase multiple meter socket assembly of claim 6 wherein said second number of said meter sockets comprises three meter sockets.

8. The multi-phase multiple meter socket assembly of claim 5 wherein said B phase connector comprises a generally Z-shaped member coupled at one end to the first section of said first supply bus and at the other end to said B phase bus.

9. The multi-phase multiple meter socket assembly of claim 5 wherein said A phase connector and said C phase connector each comprise a conductive member and a fastener; wherein said conductive member of said A phase connector is interposed between said A phase bus and the separate second section of said first supply bus; wherein said C phase connector is interposed between said C phase bus and said second supply bus; and wherein said fastener is structured to secure said conductive member, when tightened.

10. A meter center comprising:
a cabinet including a meter compartment;
a plurality of meters; and
a meter socket assembly comprising:
   a plurality of meter sockets housed by said meter compartment and receiving said meters;
   a plurality of feeder buses extending from said cabinet,
   a plurality of supply buses, each of said supply buses being in electrical communication with said meter sockets and including at least one section which is in electrical communication with a corresponding one of said feeder buses, and
   a plurality of phase connectors, each of said phase connectors electrically interconnecting a corresponding one of said at least one section of each of said supply buses with a corresponding one of said feeder buses in order to provide electrical communication therebetween,
wherein at least one of said supply buses is divided in order to include as said at least one section, a first section and a separate second section spaced apart from the first section, thereby being in electrical communication with more than one of said feeder buses in order to simultaneously provide said meter sockets with a plurality of phase configurations within said cabinet.

11. The meter center of claim 10 wherein said feeder buses comprise a first feeder bus, a second feeder bus, a third feeder bus, and a neutral bus; and wherein said supply buses comprise a first supply bus and a second supply bus.

12. The meter center of claim 1 wherein said first feeder bus, said second feeder bus, said third feeder bus, and said neutral bus extend substantially horizontally with respect to said meter sockets; and wherein said first and second supply buses extend generally vertically with respect to said meter sockets.

13. The meter center of claim 11 wherein said at least one of said supply buses is said first supply bus; wherein the first section of said first supply bus is electrically connected to a first number of said meter sockets; wherein the separate second section of said first supply bus is electrically connected to a second number of said meter sockets; and wherein said second supply bus is electrically connected to both said first number of said meter sockets and said second number of said meter sockets.

14. The meter center of claim 13 wherein said first feeder bus is an A phase feeder bus; wherein said second feeder bus is a B phase feeder bus; wherein said third feeder bus is a C phase feeder bus; wherein said plurality of phase connectors includes an A phase connector, a B phase connector, and a C phase connector; wherein said A phase connector electrically connects the separate second section of said first supply bus to said A phase bus; wherein said B phase connector electrically connects the first section of said first supply bus to said B phase bus; and wherein said C phase connector electrically connects said second supply bus to said C phase bus, in order to provide as said plurality of phase configurations a first phase configuration of said first number of said meter sockets, BC, and a second phase configuration of said second number of said meter sockets, AC.

15. The meter center of claim 14 wherein said meter center includes as said first number of said meter sockets, two meters having as said first phase configuration, BC; and wherein said meter center includes as said second number of said meter sockets, at least two meter sockets having as said second phase configuration, AC.

16. The meter center of claim 15 wherein said second number of said meter sockets comprises three meter sockets.

17. The meter center of claim 14 wherein said B phase connector comprises a generally Z-shaped member coupled at one end to the first section of said first supply bus and at the other end to said B phase bus.

18. The meter center of claim 14 wherein said A phase connector and said C phase connector each comprise a conductive member and a fastener; wherein said conductive member of said A phase connector is interposed between said A phase bus and the separate second section of said first supply bus; wherein said C phase connector is interposed between said C phase bus and said second supply bus; and wherein said fastener is structured to secure said conductive member, when tightened.

19. The meter center of claim 10 wherein said cabinet is a single cabinet; wherein said meters comprise watt-hour meters which are all housed by said single cabinet; wherein said phase configurations within said single cabinet comprise a first phase configuration and a second phase configuration; wherein a first number of said watt-hour meters have said first phase configuration; and wherein a second number of said watt-hour meters have said second phase configuration, which is different from said first phase configuration.

20. A meter center comprising:
a plurality of cabinets, each of said cabinets including a meter compartment, a plurality of meters, and a meter socket assembly comprising:
   a plurality of meter sockets housed by said meter compartment and receiving said meters,
   a plurality of feeder buses,
   a plurality of supply buses, each of said supply buses being in electrical communication with said meter sockets and including at least one section which is in electrical communication with a corresponding one of said feeder buses, and
   a plurality of phase connectors, each of said phase connectors electrically interconnecting a corresponding one of said at least one section of each of said supply buses with a corresponding one of said feeder buses in order to provide electrical communication therebetween,
wherein at least one of said supply buses is divided in order to include as said at least one section, a first section and a separate second section spaced apart from the first section, said at least one of said supply buses being in electrical communication with a plurality of said feeder buses in order to simultaneously provide said meter sockets with a plurality of phase configurations within each of said cabinets, and
wherein a plurality of said cabinets are ganged together in order to provide electrical communication therebetween.

* * * * *